United States Patent
Paranjpe et al.

(10) Patent No.: US 6,461,675 B2
(45) Date of Patent: *Oct. 8, 2002

(54) METHOD FOR FORMING A COPPER FILM ON A SUBSTRATE

(75) Inventors: Ajit P. Paranjpe, Sunnyvale; Mehrdad M. Moslehi, Los Altos; Lino A. Velo, San Ramon, all of CA (US); Thomas R. Omstead, Austin, TX (US); David R. Campbell, Sr., Rochester, NY (US); Zeming Liu, Austin, TX (US); Guihua Shang, Sunnyvale, CA (US)

(73) Assignee: CVC Products, Inc., Rochester, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/113,852

(22) Filed: Jul. 10, 1998

(65) Prior Publication Data

US 2002/0006468 A1 Jan. 17, 2002

(51) Int. Cl.⁷ .......................... C23C 16/06; C23C 16/18
(52) U.S. Cl. ................... 427/250; 427/255.394; 427/255.7; 427/553; 438/761
(58) Field of Search ................. 427/250, 255.7, 427/255.394, 96, 97, 98, 99, 553; 438/761

(56) References Cited

U.S. PATENT DOCUMENTS

| | | | |
|---|---|---|---|
| 4,792,378 A | 12/1988 | Rose et al. | |
| 4,825,809 A | 5/1989 | Mieno | |
| 4,948,623 A | * 8/1990 | Beach et al. | 427/586 |
| 4,970,093 A | 11/1990 | Sievers et al. | |
| 5,082,542 A | 1/1992 | Moslehi et al. | |
| 5,085,731 A | * 2/1992 | Norman et al. | 216/105 |

(List continued on next page.)

FOREIGN PATENT DOCUMENTS

| | | | |
|---|---|---|---|
| EP | 0 093 971 A2 | 11/1983 | ........... H01L/29/40 |
| EP | 0 297 348 A1 | 1/1989 | |
| EP | 0698918 A1 | 2/1996 | |
| EP | 0 725 439 A2 | 8/1996 | |
| EP | 0 881 673 A2 | 12/1998 | |

OTHER PUBLICATIONS

George, Joy, "Preparation of Thin Films". Marcel Dekker, Inc., New York, 1992, p.x.*

English language translation of Abstract from Japanese Patent application No. 10242409, Apr. 30, 1997.

(List continued on next page.)

Primary Examiner—Bret Chen
(74) Attorney, Agent, or Firm—Baker Botts L.L.P.

(57) ABSTRACT

Adhesion of a copper film, such as a copper interconnect, to a substrate underlayer, such as a substrate diffusion barrier, is enhanced with adhesion promotion techniques. The adhesion promotion techniques can repair the interface of the copper film and the substrate to enhance adhesion of the copper film for high-yield formation of inlaid copper metal lines and plugs. For instance, thermal annealing of a seed layer, including a copper seed layer, an alloy seed layer or a reactant seed layer, can repair contamination at the interface of the seed layer and the substrate. Alternatively, the adhesion promotion techniques can avoid contamination of the interface by depositing an inert seed layer, such as a noble (e.g., platinum) or passivated metal seed layer, or by depositing the seed layer under predetermined conditions that minimize contamination of the interface, and then depositing a bulk copper layer under predetermined conditions that maximize throughput. Alternatively, the adhesion promotion techniques can avoid the formation of an interface by graduated deposition of a first material and copper.

71 Claims, 3 Drawing Sheets

U.S. PATENT DOCUMENTS

| | | | |
|---|---|---|---|
| 5,098,516 A | * 3/1992 | Norman et al. | 216/78 |
| 5,112,448 A | 5/1992 | Chakravorty | |
| 5,231,751 A | * 8/1993 | Sachdev et al. | 29/852 |
| 5,268,034 A | 12/1993 | Vukelic | |
| 5,312,509 A | * 5/1994 | Eschbach | 427/250 |
| 5,354,712 A | * 10/1994 | Ho et al. | 437/195 |
| 5,453,124 A | 9/1995 | Moshehi et al. | |
| 5,464,656 A | 11/1995 | Verkade | |
| 5,595,606 A | 1/1997 | Fujikawa et al. | |
| 5,624,498 A | 4/1997 | Lee et al. | |
| 5,674,787 A | 10/1997 | Zhao et al. | |
| 5,677,244 A | * 10/1997 | Venkatraman | 437/198 |
| 5,723,028 A | 3/1998 | Poris | |
| 5,730,801 A | 3/1998 | Tepman et al. | |
| 5,736,191 A | * 4/1998 | Biernath | 427/96 |
| 5,763,953 A | 6/1998 | Iijima et al. | |
| 5,789,321 A | 8/1998 | Ohshita | |
| 5,843,516 A | 12/1998 | Derbenwick et al. | |
| 5,852,088 A | 12/1998 | Dismukes et al. | |
| 5,866,237 A | 2/1999 | Angelopoulos | |
| 5,891,348 A | 4/1999 | Ye et al. | |
| 5,891,513 A | * 4/1999 | Dubin et al. | 427/98 |
| 5,916,359 A | 6/1999 | Baum et al. | |
| 5,948,467 A | * 9/1999 | Nguyen et al. | 427/99 |
| 6,015,917 A | 1/2000 | Bhandari et al. | |
| 6,071,809 A | * 6/2000 | Zhao | 438/634 |
| 6,126,806 A | * 10/2000 | Uzoh | 205/182 |
| 6,130,161 A | * 10/2000 | Ashley et al. | 438/687 |
| 6,225,221 B1 | * 5/2001 | Ho et al. | 438/678 |

OTHER PUBLICATIONS

English language translation of Abstract from Japanese Patent Application No. 06203379, Jul. 22, 1994.

English language translation of Abstract from Japanese Patent Application 07057312, Mar. 3, 1995.

XP000555612 Paranjpe, et al., "Chemical vapor deposition TiN process for contact/via barrier applications" Journal of Vacuum Science and Technology: Part B, U.S., American Institute of Physics, New York. No Page Numbers, Sep. 1, 1995.

XP000531565 Eizenberg, et al., "Chemical vapor deposited TiCN: A new barrier metallization for submicron via and contact applications", Journal of Vacuum Science and technology: Part A, U.S., American Institute of Physics, New York. No Page Numbers, May 1, 1995.

English Language Translation of Abstract from Japanese Patent No. 10092977, Apr. 10, 1998.

Cote, et al. "An Evaluation of Cu Wiring in a Production 64Mb DRAM," IBM Semiconductor Research and Development Center, IBM Microelectronics Division, Hopewell Junction, NY, 1998 Symposium on VLSI Technology Digest of Technical Papers, pp. 24–25.

Woo, et al. "A High Performance 3.97 $\mu^2$ CMOS SRAM Technology Using Self–Aligned Local Interconnect and Copper Interconnect Metalization," Networking and Computing Systems Group, Process Technology Development, Motorola Inc., Austin, TX, 1998 Symposium on VLSI Technology Digest of Technical Papers, pp. 12–13.

Zhao, et al. "A Cu/Low–k Dual Damascene Interconnect for High Performance and Low Cost Integrated Circuits" Rockwell Semiconductor Systems, 4311 Jamboree Road, Newport Beach, CA, 1998 Symposium on VLSI Technology Digest of Technical Papers, pp. 28–29.

Schulz, et al. "A High–Performance Sub–0.25 $\mu$m CMOS Technology with Multiple Thresholds and Copper Interconnects" IBM Semiconductor Research and Development Center, Hopewell Junction, NY, 1998 Symposium on VLSI Technology Digest of Technical Papers, pp. 18–19.

Denning, et al. "An Inlaid CVD Cu Based Integration for Sub 0.25 $\mu$m Technology" Advanced Products Research and Development Laboratory, Motorola, 3501 Ed Bluestein Blvd., Austin, TX, 1998 Symposium on VLSI Technology Digest of Technical Papers, pp. 22–23.

Strumm, et al., "Selectivity in low pressure chemical vapor deposition of copper from hexafluoroacetylacetonate–copper (I)–trimethylvinysilane in the presence of water," Materials Science and Engineering, B23 1994, pp. 48–53, Feb. 1994.

* cited by examiner

METHOD FOR FORMING A COPPER FILM ON A SUBSTRATE

BACKGROUND OF THE INVENTION

The fabrication of electronic devices on semiconductor substrates, such as ultra large scale integration (ULSI) device fabrication, has resulted in integrated circuit (IC) chips having substantial miniaturization of electronic device dimensions. Conventional aluminum/silicon oxide (Al/SiO2) interconnect architectures have proven inadequate to meet the demand for higher interconnect performance (e.g., IC speed and reliability lifetime) needed to support increasingly miniaturized electronic device fabrication with higher chip integrated densities. To support further miniaturization, industry has chosen copper metalization to replace aluminum.

Copper offers a number of important advantages associated with higher interconnect performance. For instance, copper can increase interconnect performance by reducing interconnect propagation delays and cross talk, and by enabling higher metalization current densities than are available with aluminum. In addition, copper offers reliability and cost advantages in the manufacturing of electronic devices. For instance, when combined with low-k dielectrics, copper's superior electromigratior performance and lower resistivity reduces the number of metalization levels needed for a given IC chip. This reduction in the number of metalization levels results in reduced manufacturing cost and/or increased yield.

A number of deposition methods allow for the deposition of copper on a substrate, including electrochemical deposition or plating, Physical-Vapor Deposition (PVD), and Metal-Organic Chemical-Vapor Deposition (MOCVD)). Plating deposits copper by creating a charge potential between a copper-containing electrochemical bath and the substrate. Although plating can deposit copper films having adequate characteristics to support interconnect functions on a substrate, plating requires additional equipment for deposition of barrier and other layers on the substrate. Moreover, electrochemical deposition (ECD) methods produce significant amounts of wet chemical waste requiring expensive disposal. These additional requirements increase manufacturing cost and complexity. By comparison, PVD and MOCVD advantageously allow clustering of copper deposition with barrier deposition and preclean processes, such as with process module reaction chambers clustered around a vacuum-integrated cluster tool available from CVC, Inc. The capability for fully vacuum-integrated deposition of the diffusion barrier and copper layers onto semiconductor substrates makes a MOCVD-based option very attractive due to the reduced complexity of the deposition process sequence and the greater equipment productivity.

Copper deposition with MOCVD provides a number of additional advantages compared with to ECD and PVD. For instance, MOCVD-deposited copper used to form integrated plugs and metal lines has excellent gap-fill characteristics at a low thermal budget, such as less than 250° C., making MOCVD deposition of copper compatible with single and dual damascene processing and compatible with low-k polymer dielectrics. The resulting interconnect architectures provide low metal resistivity, reduced interconnect propagation delay and cross-talks, and good electromigration lifetime characteristics.

Although MOCVD copper deposition can form high-quality copper films to act as integrated circuit conductive interconnects, the films frequently have poor adhesion to underlying diffusion barrier layers. Poor adhesion between the copper film and the underlying barrier is attributed to interface contamination that is formed during conventional MOCVD copper processes using commonly available precursors. The interfacial contaminates which can have a detrimental impact on copper film adhesion include carbon and fluorine, both present in common copper MOCVD precursors. A copper film formed with conventional MOCVD to interface with a substrate barrier layer frequently fails to pass the scribe plus tape pull test, and can separate from the barrier during chemical-mechanical polishing (CMP) processes used to form inlaid conductive copper plugs and metal lines. The scribe plus tape test is accomplished by physically scribing a tick-tac-toe design in the copper film and then attempting to lift the copper film from the barrier layer with a tape pull. If a copper film has adequate adhesion to the barrier layer, the tape pull force will not lift the film from the barrier. In contrast, failure to pass the scribe plus tape test indicates that the copper film has inadequate adhesion to the barrier layer, and that the process used for the deposition of the copper film will not support large scale commercial production of chips having copper interconnects.

SUMMARY OF THE INVENTION

Therefore a need has arisen for a method that deposits a copper film having good adhesion to an underlying layer.

A further need exist for a method that supports deposition of copper films with vacuum-deposition equipment that is compatible with the equipment used to deposit other films on the substrate.

A further need exist for a method that supports the deposition of copper films with reduced complexity and high reliability.

A further need exist for a method that will support a high-throughput fabrication of semiconductor integrated circuit, having copper interconnects.

In accordance with the present invention a method is provided that substantially eliminates or reduces disadvantages and problems associated with previously developed methods for depositing copper films on substrates.

A first material is deposited on the substrate to form an interface with an underlying layer associated with the substrate and to act as a seed layer for the copper layer. The seed layer is deposited to have good adhesion to the underlying layer of the substrate, such as the diffusion barrier of the substrate. The copper layer is then deposited on the seed layer to form the copper film on the substrate, such as the copper film that forms a copper interconnect. The first material forms a seed layer by using deposition according to first predetermined conditions that optimize adhesion of the seed layer to the underlying layer of the substrate. The copper layer is deposited on the seed layer according to second predetermined conditions, such as conditions that will optimize properties and maximize the throughput available for deposition of a copper bulk layer. For instance, the seed layer thickness can range from 50 to 500 angstroms depending on the adhesion enhancement method, and the bulk layer thickness can range from 200 to 15,000 angstroms.

One predetermined condition for depositing the seed layer is depositing the first material onto a substrate barrier to form an interface or a buffer layer between the barrier and the bulk copper layer that forms the copper interconnect, but to anneal the first material before deposition of the bulk copper layer. The first material can comprise a generally thin layer of copper that is thermally annealed at a predetermined temperature for a predetermined time. Thermal annealing promotes diffusion of copper into the barrier for atom-to-atom bonding and disassociates or displaces the contaminates associated with the interface (typically carbon, fluorine, and/or oxygen).

Alternatively, the first material can be an inert material that will have minimal reactivity with the precursor used to deposit copper (making it difficult for the precursor contaminants to get adsorbed on the surface). For instance, noble metals, such as platinum or iridium, are inert to contaminates associated with the MOCVD process, thus avoiding contamination of the interface during MOCVD deposition of copper. Similarly, passivated metals, such as tantalum nitride, titanium nitride, $TaO_xN_y$ and $TiO_xN_y$ can be used as the first material.

Alternatively, the first material can be a catalytic material, such as chromium, tin, zinc, titanium or tungsten, that alloys with copper at a relatively low temperature, and a generally thin layer of copper deposited on the catalytic layer. The catalytic material and copper are then annealed at a temperature adequate to promote alloying and interfacial bonding for excellent copper adhesion. The alloy provides good adhesion and good crystal structure to support deposition of a bulk copper layer.

Alternatively, the first material can comprise a reactant layer, such as amorphous silicon or germanium, and a generally thin layer of copper deposited on the reactant layer. The reactant layer and copper are then annealed at a temperature adequate to promote a chemical reaction (e.g. silicide or germanide) resulting in a seed layer having good adhesion and microstructural crystallinity. For instance, amorphous silicon and the thin copper layer form a copper silicide seed layer.

In one alternative embodiment the substrate surface is etched at moderate power settings before the deposition of the first material to enhance adhesion of the first material to the substrate. Etching the surface enhances surface area, promoting adhesion.

In another alternative embodiment the interface formed by the deposition of the first material is intermixed with the substrate barrier by the application of a high energy ion beam to the interface.

In another embodiment the seed layer comprises copper deposited with chemical-vapor deposition by using a precursor that minimizes contaminates, or using vaporization of deposition conditions that minimize the formation of contaminants at the interface, thus, enhancing adhesion of the copper seed layer to the substrate. The bulk copper layer is then deposited using chemical-vapor deposition methods that optimize other properties and maximize throughput with the deposition of copper at an optimal rate.

In one alternative method the seed layer is CuX composite where X is a metal other than copper. The seed layer is formed on a substrate by depositing a first material on the substrate at a first deposition rate using chemical-vapor deposition and a precursor associated with the first material (X). Copper is then simultaneously deposited (co-deposited) using chemical-vapor deposition and a precursor associated with copper. The deposition rate of the first material is gradually reduced to zero, while the deposition rate of the copper is gradually increased from zero to a greater copper deposition rate. The deposition of copper is then continued until either a seed layer is deposited or the bulk copper layer is fully deposited. The first material can comprise aluminum, chromium, tantalum nitride, W, $WN_x$, $WSi_x$ or other compatible materials that can be co-deposited with copper but that are deposited by means of a precursor that does not react with the copper precursor in the gas phase. This method advantageously avoids the formation of an abrupt interface between the substrate barrier and the copper interconnect layer by promoting intermixing and formation of a graded transition layer during the deposition process.

The present invention provides many important technical advantages. For instance, the method according to the present invention deposits a seed layer that has good adhesion with the underlying layer of the substrate. The bulk layer of copper can then be deposited on the seed layer to ensure that the copper interconnect will have good adhesion to the substrate throughout the entire semiconductor chip fabrication process flow.

Another technical advantage of the present invention is that it reduces the fabrication process complexity and types of equipment needed to deposit a copper film layer. For instance, the method according to the present invention allows deposition of a copper layer with good adhesion using chemical-vapor deposition (such as metal-organic chemical-vapor deposition or MOCVD) equipment compatible with the deposition of other materials on the substrate.

Another technical advantage of the present invention is that it reduces the complexity of the deposition of the copper layer by promoting the copper layer adhesion in reaction chambers that are compatible with vacuum-integrated cluster equipment. The reduced complexity and enhanced controllability of the deposition process with cluster equipment increases the reliability of the process.

Another important technical advantage of the present invention is that it allows increased throughput for the commercial production of semiconductor chips having copper interconnects. The use of existing chemical-vapor deposition process chambers and cluster equipment without substantial increases in the processing steps increases the manufacturing capacity and throughput.

Another technical advantage is that these methods are suitable and scalable to small feature sizes of high aspect ratio structures such as those that are commonly encountered in advanced interconnects.

BRIEF DESCRIPTION OF THE DRAWINGS

A more complete understanding of the present invention and advantages thereof may be acquired by referring to the following description taken in conjunction with the accompanying drawings in which like reference numbers indicate like features and wherein.

DETAILED DESCRIPTION OF THE INVENTION

Preferred embodiments of the present invention are illustrated in the Figures, like numeral being used to refer to like and corresponding parts of the various drawings.

Figure 1:
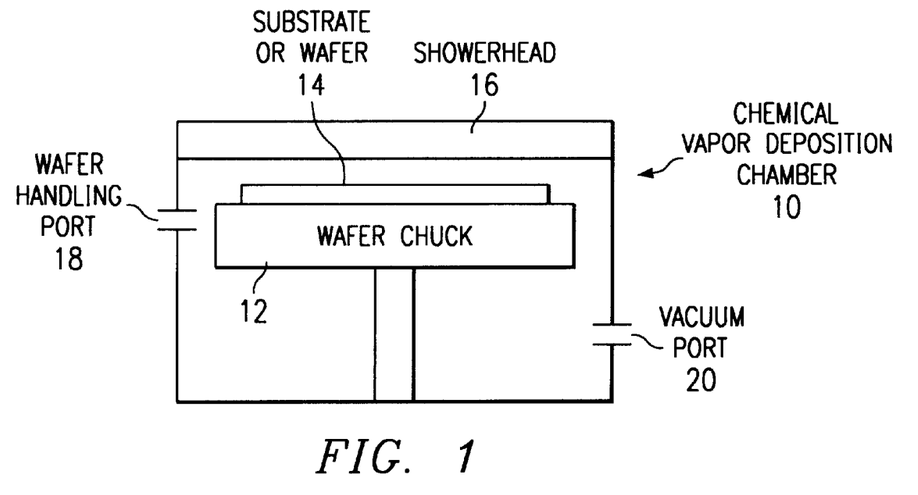
FIG. 1 depicts a side view of a chemical-vapor deposition chamber.

Chemical-vapor deposition (CVD) is a well-established method of depositing a material layer on a substrate in support of the fabrication of an electronic device such as a semiconductor IC on the substrate. Referring now to FIG. 1, a typical chemical-vapor deposition reaction chamber 10 is depicted. A substrate wafer chuck 12 supports a substrate wafer 14 proximate to a showerhead 16. Wafer handling port 18 can cooperate with a cluster hub to support automatic handling of the substrate among different reaction chamber process modules. Vacuum port 20 cooperates with vacuum pump components to evacuate chemical-vapor deposition reaction chamber 10, thus establishing a low-pressure processing environment and an even flow of gases from showerhead 16 over substrate 14 and through vacuum port 20.

To deposit a material layer on a substrate with chemical-vapor deposition, a gaseous precursor flows from showerhead 16 across substrate wafer 14 and exits chemical-vapor deposition reaction chamber 10 through vacuum port 20. As the precursor flows over substrate or wafer 14, the precursor undergoes a chemical reaction resulting in deposition of a material film on substrate 14. The type of material deposited and quality of the film deposited can be controlled by controlling the environment in the chemical-vapor deposition reaction chamber in accordance with the characteristics of the precursor.

Figure 2:
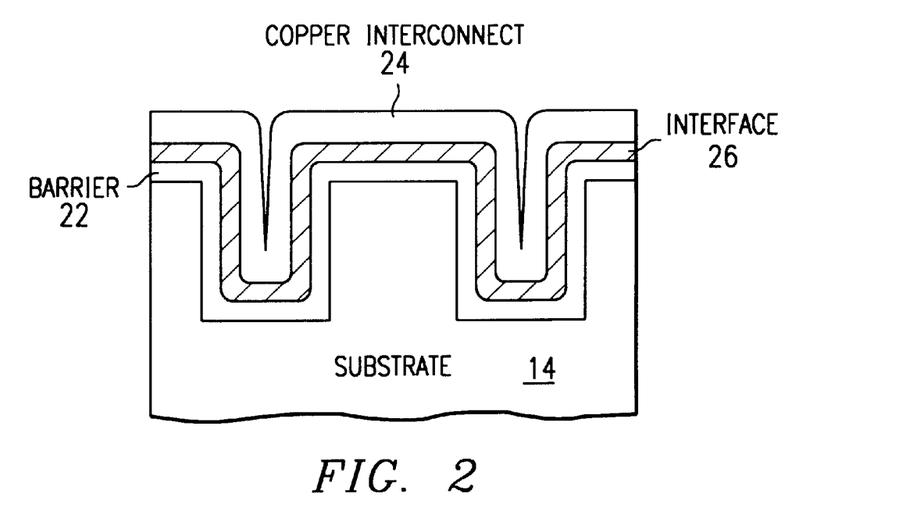
FIG. 2 depicts a side view of a copper interconnect layer deposited on the barrier of a substrate.

Referring now to FIG. 2, a multi-layer structure that can be formed with chemical-vapor deposition is depicted. Substrate 14 has a barrier layer 22 deposited on it. Typical barrier layers include barriers formed with tantalum and tantalum nitride, TiN, $WN_x$, or ternary barriers by using conventional chemical-vapor deposition or other deposition techniques. A copper interconnect layer 24 is deposited on top of the underlying barrier layer 22.

Conventional semiconductor chips used aluminum interconnected layers instead of the copper interconnect layer depicted by FIG. 2. The introduction of copper interconnect layers offers a number of advantages for miniaturization as well as performance and reliability improvement of semiconductor integrated circuits. The difficulty of using a copper interconnect layer 24 using a chemical-vapor deposition process lies with the relatively poor adhesion between copper interconnect layer 24 and barrier layer 22 (thus, making it difficult to form inlaid copper interconnect structures using a chemical-mechanical polishing or CMP process). When an interface 26 exists between copper interconnect layer 24 and barrier layer 22, the interface 26 can degrade the adhesion strength of copper interconnect layer 24 to barrier layer 22. This poor adhesion of the copper interconnect layer 24 to the barrier layer 22 has limited the commercial usefulness of copper interconnects for semiconductor integrated circuits because of poor manufacturability of copper deposition, particularly using the known MOCVD methods.

Metal-organic chemical-vapor deposition (MOCVD) is one promising emerging technology for mainstream applications including ultra-large-scale integrated (ULSI) circuit chip fabrication. In particular, CUPRASELECT [Cu(I)(hfac)(tmvs)] is a promising volatile liquid precursor for MOCVD. Suitable MOCVD precursors such as Cu(I)(hfac)(tmvs) deposit copper onto a substrate surface by associating the copper with hexafluoro-acetyle-acetonate (hfac) ligands that bond with copper atoms. The "hfac" ligands release the copper atoms for deposition onto the substrate during chemical-vapor deposition (CVD) when certain predetermined temperature and flow conditions are met. However, some of the "hfac" ligands may be liberated during vaporization of the precursor. Barrier 22 can extract "hfac" ligands from the precursor during the initial stages of deposition resulting in contamination (such as with carbon, oxygen, and fluorine atoms), degraded cleanliness of interface 26 and poor adhesion of the deposited copper to the diffusion barrier.

Another factor that can effect the quality of the adhesion of an MOCVD-based copper film 24 to a barrier 22 is the nucleation delay associated with the deposition of copper from the precursor. The early stages of MOCVD copper deposition are critical to achieve a textured copper film with uniform grain size distribution, good adhesion, and void/free filling. A high nuclei density and minimum initial nuclei size during the early stages of copper film growth (typically corresponding to a relatively short incubation time) provide a continuous film having good crystallanity. The minimum initial nuclei size can be quantitatively expressed as the product of the deposition rate and the nucleation delay. The greater the nucleation delay, the less likely that MOCVD copper deposition will result in repeatable adhesion of the deposited copper to the underlying barrier.

To obtain good adhesion of a copper layer 24 to a barrier 22 one key factor is to reduce nucleation delay, particularly during the early stages of MOCVD copper deposition (so-called incubation time). Nucleation delay depends on process conditions, the type of underlayer, and surface treatment, and can be minimized with an optimal combination of precursor flow, substrate temperature, and carrier gas flow. Although nucleation delay is relatively invariant with pressure and barrier type, it does approach zero when deposition is started on a clean copper surface. Thus, although nucleation delay can be reduced through a proper choice of process conditions, good adhesion of a copper layer to an underlying substrate layer can best be achieved by depositing the bulk amount of the copper layer onto a copper containing seed layer or another suitable material layer that has good adhesion to the underlying barrier layer.

To establish a seed layer with good adhesion to the underlying layer, a number of adhesion promotion techniques can be used according to this invention. These adhesion promotion techniques seek to establish strong atom-to-atom bonding between copper layer 24 and barrier layer 22 at interface 26. If interface 26 is a copper containing seed layer having good bonding to barrier 22, then the deposition of a bulk layer of copper on the seed layer will result in good adhesion between the bulk layer and the seed layer at interface 26. To achieve good adhesion, the adhesion promotion techniques repair interface 26, avoid contamination of interface 26 is during initial deposition, or avoid the formation of interface 26 altogether. Each of these options are described with reference to FIGS. 3–6 below.

Figure 3:
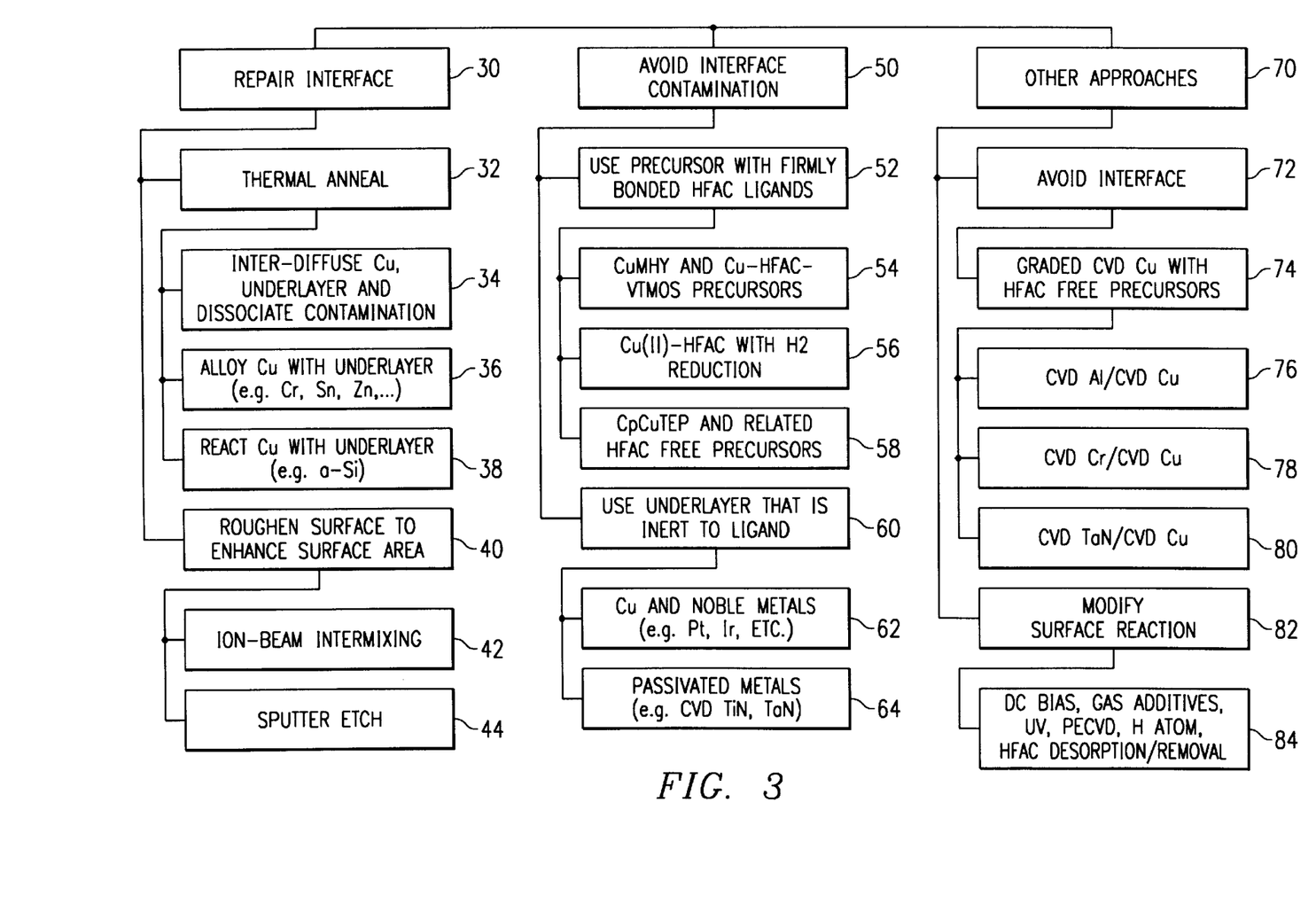
FIG. 3 depicts a block diagram summarizing adhesion promotion techniques that avoid contamination of the interface, and otherwise promote copper layer adhesion.

Referring now to FIG. 3, a block diagram depicts alternative adhesion promotion techniques that can enhance and improve the repeatability of good adhesion of copper layer 24 to barrier layer 22. One adhesion promotion technique, represented by the repair interface block 30, assumes poor adhesion at interface 26, and seeks to repair interface 26 to create a seed layer for supporting a bulk copper deposition with good adhesion to the seed layer. Poor adhesion at interface 26 can be caused by oxygen, carbon, flourine and other contamination that is a consequence of the mechanism for copper deposition from copper (I) precursors such as Cu(I)(hfac)(tmvs).

To repair or reduce contamination at interface 26, a thermal anneal, as depicted at block 32 may be used. As depicted by block 34, thermal annealing can enhance interface 26 adhesion to barrier 22 by promoting diffusion of a copper seed at interface 26 with barrier 22 and by disassociating or displacing contamination associated with the copper seed. Alternatively, as depicted by block 36, thermal annealing can enhance interface adhesion by alloying copper with an underlying alloying material at interface 26. Alternatively, as depicted by block 38, thermal annealing can enhance interface adhesion by chemically reacting copper at interface 26 with a reactant underlayer in order to form a copper compound transition layer.

Block 40 depicts that repair of the interface can involve various treatments to the surface of barrier 22 to enhance the surface area of barrier 22 for accepting deposited copper with good adhesion. One method, depicted by block 42, involves exposing interface 26 to an energetic ion beam to promote intermixing of interface 26 and barrier 22, resulting in improved atom-to-atom bonding. An alternative treatment, depicted by block 44, involves sputter etching of barrier 22 before deposition of a seed layer to form interface 26. Sputter etching of barrier 22 roughens its surface (and may also change the stoichiometry of the barrier layer at its surface to make it more reactive or more easily alloyable with copper), thus providing greater surface area for atom-to-atom bonding with interface 26. The improved bonding available with sputter etching of barrier 22 can, for instance, reduce the need for extensive thermal annealing to establish adequate adhesion for accepting deposition of a bulk copper layer.

A second type of adhesion promotion technique is to avoid contamination at interface 26, as depicted by block 50. Contamination of interface 26 can be avoided by depositing interface 26 with precursors having firmly bonded "hfac" ligands, as depicted by block 52. The available precursors, depicted by blocks 54, 56 and 58, can establish a seed layer with minimal contamination, but are not optimal precursors for the deposition of a bulk copper layer (due to the higher resistivity of copper deposited by these alternative precursors). Thus, once a seed copper layer is deposited as interface 26 using a suitable precursor, an alternative precursor such as CUPRASELECT can be used to deposit the bulk copper layer 24 to form the copper interconnect lines and plugs.

Another adhesion promotion technique that avoids interface contamination is the deposition of an underlayer at interface 26 to establish a seed layer, followed by the bulk deposition of copper, as depicted by block 60. Block 62 depicts that copper or other noble metals, preferably noble metals such as platinum or palladium or iridium, can form a seed layer inert to precursor ligands which will support the deposition of a bulk layer with good adhesion. Block 64 depicts that a passivated metal such as titanium nitride or tantalum nitride can be used as the seed layer. Alternatively, the passivated metal can comprise metal oxynitrides such as $TiO_x N_y$ or $TaO_x N_y$ deposited at interface 26 to form a seed layer. The passivated metal minimizes reactions with ligands used to deposit the bulk copper layer. Passivated metals can embed contaminants within barrier 22 to minimize the effect of the contaminants on interface 26 and adhesion of the bulk copper layer 24.

Block 70 depicts other viable approaches for copper adhesion promotion. One alternative approach, depicted at block 72, is to avoid the formation of an interface at barrier 22. As indicated at block 74, graduated chemical-vapor deposition (CVD) of copper can promote intermixing of copper with barrier 22 using simultaneous deposition (co-deposition) of an adhesion promotion material and copper. For instance, block 76, 78 and 80, depict that aluminum, chromium, tantalum nitride, W, $WN_x$, and $WSi_x$ are materials available for simultaneous chemical-vapor deposition with copper that can promote a well-bonded seed layer with good intermixing on which a bulk copper layer can be deposited.

Other adhesion promotion approaches can, as depicted by block 82, involve modification of the reaction at the surface of barrier 22. For instance, as depicted by block 84, the use of DC-bias, gas additives, ultraviolet light or UV, PECVD, H-atom, and hfac desorption and removal can each modify surface reactions to promote adhesion of copper to barrier 22.

The adhesion promotion techniques depicted by the block diagram of FIG. 3 can be used individually and in combination with each other to promote adhesion of a copper layer to a substrate or to an underlying barrier layer no a substrate. A combination of techniques can be selected according to the characteristics of the copper layer to be formed and the characteristics of the underlayer on which the copper layer is formed.

Figure 4:
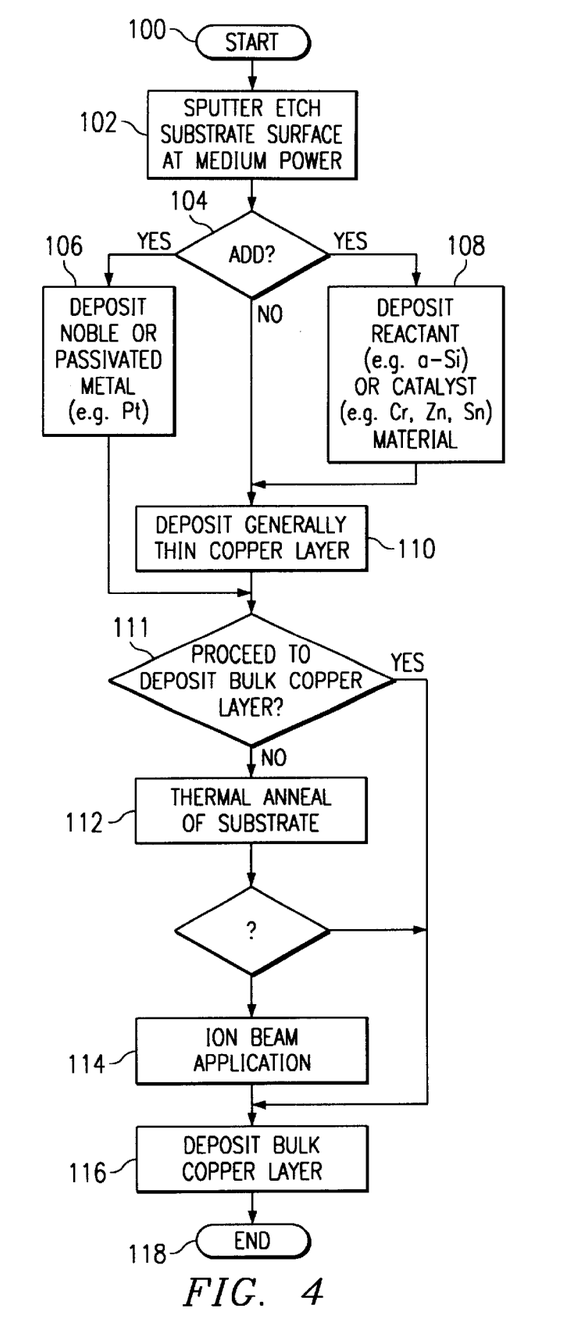
FIG. 4 depicts a flow diagram of steps for depositing a copper layer on a substrate.

Referring now to FIG. 4, some potential steps are depicted that combine a number of adhesion promotion techniques for the deposition of copper on a substrate. From start 100 the substrate is prepared for treatment in a reaction or substrate processing chamber. At step 102, the substrate is optionally sputter etched at medium power to roughen up and modify the surface of the barrier layer (or the surface of a dielectric layer) that will accept the copper layer. Sputter etching involves plasma treatment of the barrier surface in an inert, such as argon, or chemically reducing, such as argon/hydrogen, ambient. An example of a moderate power setting is etching at 200 watts in six mTorr of argon for sixty seconds. Substantially higher or lower power levels will reduce the effectiveness of sputter etching due to either insufficient or excessive etch and roughening of the barrier surface.

The roughening of the barrier surface by sputter etching provides additional barrier surface area for adhesion of subsequent copper layers. Although sputter etching is generally inadequate to ensure good adhesion of a subsequent copper layer on a repeatable basis, sputter etching will reduce the thermal budget needed with a post-deposition thermal anneal for a given set of deposition conditions. This reduced thermal budget requirements can ensure compatibility of MOCVD copper deposition techniques with low-K polymer dielectrics. Thus, although sputter etching is not needed for adhesion promotion, it can be added as a step to enhance the effectiveness of other adhesion promotion techniques.

At step 104, a determination is made regarding whether to add an additional adhesion promotion material to the substrate. One "yes" determination can lead to the deposition of an inert adhesion promotion material that avoids interface contamination. For instance, at step 106, a generally thin layer of a noble or passivated metal such as platinum, meaning a layer of between approximately 5 and 300 angstroms thick, is deposited on the barrier of the substrate to act as a seed layer or adhesion promoter layer to accept a copper bulk layer. The noble metal, such as platinum or palladium or iridium, and the passivated metals, such as titanium nitride or tantalum nitride, are inert or minimally reactive with the ligands used in MOCVD copper deposition. The inert underlayer formed by the noble metal or passivated metal supports MOCVD copper deposition with minimal nucleation delay and helps enhance adhesion of the deposited copper bulk layer by avoiding the adsorption/chemisorption of contaminants from the ligands by the barrier and by embedding any contaminants that are absorbed within the barrier instead of the interface. The noble or passivated metals can be deposited using conventional techniques, including CVD, MOCVD, PVD, and plating (preferably by CVD or MOCVD). Once the inert underlayer is deposited to form a seed layer for the copper bulk layer, MOCVD can proceed immediately, or, alternatively, additional adhesion promotion techniques can be accomplished, as depicted by step 111.

Alternatively, if the determination at step 104 is a "yes", then, as depicted at step 108 a reactant or a catalyst layer can be deposited on the barrier. One reactant material is amorphous silicon. Some examples of catalyst materials are chromium, zinc, tin, and tungsten. The reactant and catalyst materials can be deposited on the barrier surface by conventional means, including CVD, MOCVD, PVD and plating (preferably by CVD or MOCVD or PECVD).

At step 110 a generally thin copper layer is deposited onto the substrate. In select cases, particularly such as with deposition of a noble metal such as platinum, the entire copper deposition (initial nucleation/seed copper plus the bulk copper layer) can be deposited without a need for an interim thermal anneal process 112, thus, simplifying the adhesion improvement process. Step 111 depicts a determination of whether to proceed with a thermal anneal at step 112 or to proceed directly to bulk copper deposition at step 116. If the determination at step 104 is no, the thin copper layer at step 110 is deposited directly onto barrier 22. If a reactant or catalyst material was deposited at step 108, then the thin copper layer is deposited on top of the reactant material underlayer or catalyst material underlayer. The thickness of the generally thin copper layer at step 110 can vary dependent upon the characteristics of the deposition process; however, a film of approximately 500 angstroms or less (preferably in the range of 100 Å to 500 Å is generally desirable. The reactant or catalyst underlayer, if applied, is also generally thin having a thickness between approximately 5 to 200 angstroms. The generally thin copper layer and any underlying layer are intended to form a seed layer at the interface of the barrier that will support growth of a high quality copper bulk layer.

At step 112 the substrate with the seed layer is subjected to thermal annealing (as described before, some methods such as platinum seed may not need the thermal annealing step). Generally, annealing of the seed layer involves heating the substrate to a temperature of 250° C. to 400° C. for one to ten minutes in an inert ambient, such as argon. If the seed layer is copper on a reactant material such as amorphous silicon or germanium, the annealing will form copper silicide or copper germanide having good adhesion to the substrate and barrier due to the fused bonded interface.

If, at step 112, the seed layer is copper on a catalyst material such as chromium or tin, the annealing will result in formation of an alloy having good adhesion to the substrate barrier. Tin and chromium each have a high wettability for copper and can easily alloy under thermal annealing conditions. The alloy formed by annealing establishes a good seed layer with good substrate adhesion and minimum contamination. For instance, tin and chromium can be deposited by co-sputtering with the barrier, by using an alloy target, or by CVD or MOCVD or PECVD having a tin or chromium precursor. Barrier engineering, such as selecting a barrier with alpha tantalum, alpha tantalum nitride, beta tantalum, or beta tantalum nitride, can effect the adhesion of the catalytic material to the barrier.

If the seed layer is only copper deposited on the barrier, thermal annealing can enhance the adhesion of the copper to the barrier by disassociating and/or displacing (diffusing) the contaminants associated with the interface of the generally thin copper layer and the substrate barrier. In addition, thermal annealing promotes diffusion of copper into the substrate barrier to give atom-to-atom bonding of the copper with the barrier material.

The effectiveness of thermal annealing for the establishment of a seed layer with good adhesion depends upon the annealing temperature, the annealing time, and the copper seed thickness. The following Table 1 shows the dependence of adhesion (as measured by scribe and tape pull test) of a 500 angstrom CVD copper seed layer deposited on a c-PVD tantalum and c-PVD tantalum nitride barrier:

TABLE 1

|                   | Anneal time @ 370° C. | | | | |
| ----------------- | ----- | ----- | ----- | ----- | ------ |
|                   |       |       |       |       |        |
| 500 Å CVD Cu      | 0 min | 2 min | 4 min | 7 min | 10 min |
| Scribe + tape test| fail  | fail  | pass  | pass  | pass   |

As depicted by Table 1, an anneal time of 4 minutes at 370° C. will result in a seed layer that passes the scribe plus tape test for adhesion.

Another important factor affecting the adhesion of the copper seed layer to the barrier is the thickness of the copper seed layer. Table 2 depicts the results of a scribe plus tape test on a substrate with a bulk copper layer deposited on a seed copper layer that was subjected to thermal annealing:

TABLE 2

|             | $2^{nd}$ Cu layer | | | |
| ----------- | ---- | ------ | ------ | ------ |
| $1^{st}$ Cu layer | 0 Å  | 3000 Å | 5000 Å | 7000 Å |
| 150 Å       |      | pass   |        |        |
| 250 Å       | pass | pass   | pass   | pass   |
| 325 Å       |      | pass   |        |        |
| 500 Å       | pass | pass   | fail   | fail   |
| 5000 Å      | fail |        |        |        |

As can be seen from Table 2, a thin copper seed layer will provide better adhesion for a subsequently deposited bulk copper layer than a thick (e.g., $\geq 1000$ Å) copper seed layer. The better adhesion provided by the thin copper seed layer is probably due to delamination caused by interfacial strain associated with the mismatch in thermal expansion between copper and the substrate if a thicker Cu seed layer is used. The delamination deteriorates adhesion repeatability if it occurs before interfacial reactions and diffusion can occur. Thinner copper seed layers can accommodate thermal stress without interface shear. For instance, a 250 angstrom MOCVD copper seed layer can, after thermal annealing, support with good adhesion MOCVD copper films with a thickness greater than 1 micrometer ($\mu$m). There is, however, a lower limit for the thickness of the initial copper seed layer since a very thin (e.g., $\leq 100$ Å) copper seed layer may disintegrate and ball up prematurely upon anneal.

At step 114, a high energy ion beam application can be directed at the seed layer and barrier to physically force intermixing of the seed layer and barrier at the interface. Ion beam intermixing relies on the knock-on effect to drive atoms from the established crystal lattice into the barrier, resulting in better atom-to-atom bonding. However, ion beam intermixing has limited effectiveness due to the high energy demands needed for intermixing of between one and ten kiloelectron volts, resulting in possible device damage. Further, the seed layer for ion beam intermixing should be approximately no more than 50 angstroms to avoid absorption of the energy of the ion beam by the surface of the seed layer rather than causing intermixing at the interface and barrier.

At step 116 deposition of the bulk layer to form the copper interconnect is performed. If the seed layer provides a clean starting copper surface, or a seed layer having minimal contamination, nucleation delay approaches zero for bulk copper deposition. With nucleation delay approaching zero, MOCVD deposition results in a high quality copper film with uniform grain size distribution (and preferably relatively large grains), good adhesion and void-free filling. One preferred means of depositing copper is MOCVD deposition using CU(I)(hfac)(tmvs) CUPRASELECT. Initial growth of a copper film on a substrate barrier underlayer with CUPRASELECT occurs by a mechanism that can lead to interface contamination including incorporation of fluorine, carbon and oxygen. However, the deposition method for CUPRASELECT on copper is via a disproportionation reaction which results in deposition of pure copper films having negligible contamination. Thus, when CUPRASELECT is used with MOCVD deposition on a seed layer with good adhesion (such as a copper seed or a platinum seed layer), the bulk copper layer can be deposited with good adhesion and good repeatability.

At step 118, the method for depositing a copper film ends with the deposition of a film having predetermined characteristics, including a predetermined thickness. The quality of the copper film is increased by the deposition of a high quality seed layer using predetermined conditions that emphasize the establishment of good adhesion of the seed to the substrate and preferably a relatively short (near-zero) incubation time or nucleation delay for the deposition of the bulk copper layer. Once the seed layer establishes a good structure, the deposition of a high quality bulk copper layer, making up the majority of the copper films' thickness, can proceed using predetermined conditions that emphasize bulk copper deposition (good filling properties, large grains, etc.) in support of greater process throughput. The process depicted by FIG. 4 supports deposition of a copper interconnect on a substrate barrier, but can also support deposition of copper layers at other points in the fabrication process.

Figure 5:
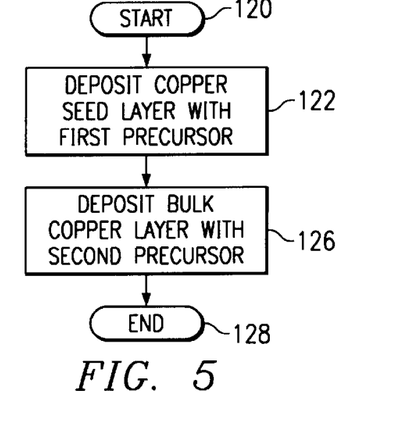
FIG. 5 depicts a flow diagram of steps for depositing a copper layer on a substrate with first and second precursors.

Referring now to FIG. 5, an alternative series of steps are depicted for the deposition of a seed layer and a bulk layer of copper to form a copper film. At start step 120, the substrate is arranged in a reaction or MOCVD process chamber. At step 122, a generally thin copper layer is deposited on the substrate to form a seed layer. The deposition at step 122 is accomplished using CVD with a first precursor that will minimize contamination of the interface formed between the bulk copper layer and the barrier of the substrate. For instance, precursors with firmly bonded ligands can be used to deposit the copper seed layer, such as CuMHY and Cu(hfac)(vtmos) precursors. These precursors are designed to disassociate copper at higher temperatures, such as 90° C. versus 70° C. for CUPRASELECT, and are thus less efficient for the deposition of bulk layers of copper. However, firmly bonded precursors can deposit a thin (e.g., $\leq 200$ Å) seed layer of copper with less contaminants, such as carbon, fluorine and oxygen, being incorporated in the copper seed-to-barrier interface. Another type of precursor than can be used at Step 122 is Cu(II)-hfac precursors. Such precursors may require treatment of the substrate by hydrogen reduction to reduce contaminants. Another type of precursor that can be used at Step 122 are precursors that are hfac-free, such as CpCuTEP precursors. The hfac-free precursors can deposit high-quality copper seed layer without contamination since hfac-free precursors do not have contaminating ligands. Again, however, these hfac-free precursors are generally a poor choice for bulk copper deposition and can only be used for deposition of thin seed layers.

At Step 126, a bulk copper layer is deposited with a second precursor, such as deposition by MOCVD with CUPRASELECT. CUPRASELECT can deposit a bulk copper layer with high material quality and good adhesion to the seed once the seed layer with excellent adhesion to the underlayer is established. CUPRASELECT will deposit copper on a copper seed with minimal nucleation delay. Alternative first precursors can deposit alternative first materials as a seed for bulk deposition with CUPRASELECT, including noble and passivated metals such as platinum. One important advantage of using a first and second precursor is that a copper film can be deposited in a single-reaction chamber with minimal handling.

Figure 6:
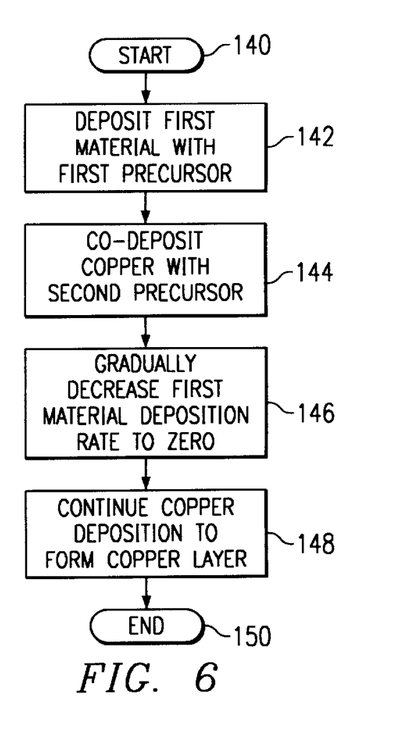
FIG. 6 depicts a flow diagram of steps for depositing a copper layer on a substrate with graduated deposition.

Referring now to FIG. 6, another alternative method for depositing a copper layer is depicted. At Step 140, the process is started by placing the substrate in a chemical-vapor deposition reaction chamber. At Step 142, a first material is deposited with a first precursor. At Step 144, copper is deposited with a second precursor, while the first material is also being co-deposited. At Step 146, the deposition rate of the first material is gradually decreased from an initial deposition rate to zero while the deposition rate of copper with the second precursor is gradually increased from zero to a full deposition rate. In this manner, a graded transition layer is formed to support the bulk deposition of a copper film. At Step 148, the deposition of copper is continued to form a copper layer, either as a seed copper layer for subsequent deposition of a bulk copper layer, or as a bulk copper layer. If a seed layer is deposited, then a bulk layer can be deposited on the seed layer using a third precursor, such as CUPRASELECT, that will maximize deposition rate on the seed.

Graded chemical-vapor deposition for co-deposition of copper plus another material can be performed with a number of materials to enhance the adhesion of copper to the substrate. For instance, aluminum, chromium, and tantalum nitride, W, $WN_x$ and $WSi_x$ can be used as the first material. An hfac-free precursor can deposit copper so that thorough mixing of the first material and the copper occurs during deposition to establish a seed layer for providing good adhesion to support a bulk copper layer. In this way, graded deposition essentially avoids the formation of an interface between the underlayer and the copper film. Preferably, the overall thickness of the graded layer is limited to less than 200 Å in order to minimize the degradation of the interconnect electrical conductivity using copper metallization. Graduated changes in deposition rates for the first and second precursors can control the amount of intermixing so that the seed layer has a diminishing amount of the first material and a greater amount of copper material as the thickness of the seed layer increases. However, the first precursor and second precursor should be compatible to avoid reactions that can affect the film deposited on the substrate. An hfac-free precursor for copper is preferred since most precursors for other materials tend to react in the gas phase with hfac-containing copper precursors.

Although the present invention has been described in detail, it should be understood that various changes, substitutions and alterations can be made hereto without departing from the spirit and scope of the invention as defined by the appended claims.

What is claimed is:

1. A method for forming a copper film on a substrate having a barrier, the method comprising the steps of:
   depositing a seed layer on the substrate barrier by a chemical-vapor deposition process using a seed layer precursor; and
   deposition a copper bulk layer on the seed layer by a metal-organic chemical-vapor deposition process using a bulk layer precursor.

2. The method according to claim 1 wherein the seed layer comprises a noble metal.

3. The method according to claim 2 wherein the noble metal comprises platinum.

4. The method according to claim 2 wherein the noble metal comprises palladium.

5. The method according to claim 2 wherein the noble metal comprises iridium.

6. The method according to claim 1 wherein the seed layer comprises an alloy layer having a noble metal and at least one other element.

7. The method according to claim 1 wherein the seed layer comprises a passivated metal.

8. The method according to claim 7 wherein the passivated metal comprises titanium nitride.

9. The method according to claim 7 wherein the passivated metal comprises a metal oxynitride.

10. The method according to claim 7 wherein the passivated metal comprises tantalum nitride.

11. The method according to claim 1 wherein the seed layer comprises a catalytic layer.

12. The method according to claim 11 wherein the catalytic layer comprises chromium.

13. The method according to claim 11 wherein the catalytic layer comprises tin.

14. The method according to claim 11 wherein the catalytic layer comprises zinc.

15. The method according to claim 11 wherein the catalytic layer comprises iridium.

16. The method according to claim 11 wherein the catalytic layer comprises tungsten.

17. The method according to claim 1 wherein the seed layer comprises a reactant layer.

18. The method according to claim 17 wherein the reactant layer comprises silicon.

19. The method according to claim 18 wherein the silicon comprises amorphous silicon.

20. The method according to claim 17 wherein the reactant layer comprises germanium.

21. The method according to claim 17 wherein the reactant layer comprises amorphous germanium.

22. The method according to claim 1 wherein said depositing a seed layer step further comprises the steps of:
   depositing a copper seed layer with the seed layer precursor; and
   directing an ion beam at the copper seed layer to promote mixing of the seed layer and the substrate barrier.

23. The method according to claim 1 wherein said depositing a seed layer step further comprises:
   sputter etching the substrate;
   depositing a copper seed layer with the seed layer precursor; and
   annealing the copper seed layer.

24. The method according to claim 1 wherein said depositing a seed layer step further comprises:
   depositing a copper seed layer with the seed layer precursor; and
   annealing the copper seed layer.

25. The method according to claim 1 wherein the seed layer precursor substantially reduces contamination of the seed layer, the seed layer precursor having firmly bonded hfac ligands.

26. The method according to claim 25 wherein the copper bulk layer precursor deposits the copper bulk layer on the seed layer with minimal nucleation delay.

27. The method according to claim 26 wherein the copper bulk layer precursor comprises Cu(I)(hfac)(tmvs).

28. The method according to claim 27 wherein the seed layer precursor comprises CuMHY.

29. The method according to claim 27 wherein the seed layer precursor comprises a Cu-hfac-vtmos precursor.

30. The method according to claim 27 wherein the seed layer precursor comprises Cu(II)-hfac, and wherein the method further comprises the step of hydrogen reduction of the Cu(II)-hfac precursor for copper deposition.

31. The method according to claim 1 wherein the seed layer precursor comprises a hfac-free precursor.

32. The method according to claim 31 wherein the hfac-free precursor comprises CpCuTEP.

33. The method according to claim 31 wherein said depositing the seed layer step comprises graded simultaneous deposition of copper and another seed material.

34. The method according to claim 33 wherein the seed material comprises aluminum.

35. The method according to claim 33 wherein the seed material comprises chromium.

36. The method according to claim 33 wherein the seed material comprises tantalum nitride.

37. The method according to claim 33 wherein the seed material comprises titanium.

38. The method according to claim 33 wherein the seed material comprises tungsten.

39. A method for forming a copper interconnect on a substrate diffusion barrier, the method comprising the steps of:
   depositing a first material on the barrier to form an interface between the barrier and the copper interconnect;
   thermally annealing the first material; and
   depositing the copper interconnect layer on the first material.

40. The method according to claim 39 wherein the said depositing the copper interconnect layer step comprises depositing copper using metal-organic chemical-vapor deposition.

41. The method according to claim 39 wherein the first material comprises copper.

42. The method according to claim 41 wherein said annealing the first material further comprises the step of heating the substrate to a temperature of between approximately 250°–400° C.

43. The method according to claim 42 wherein said annealing the first material further comprises maintaining the substrate at a temperature of between approximately 250°–400° C. for a time of between approximately one to tem minutes.

44. The method according to claim 41 wherein the interface comprises a copper layer having a thickness of approximately 500 angstroms or less.

45. The method according to claim 44 wherein said depositing the copper interconnect layer step comprises depositing the copper interconnect layer in the first material by electrochemical deposition.

46. The method according to claim 39 wherein said depositing a first material step further comprises:

depositing a catalytic material in the substrate barrier; and depositing a copper layer on the catalytic material.

47. The method according to claim 46 wherein said annealing the first material step comprises annealing the catalytic material and the copper layer to form a copper alloy bassed on thermal alloying of copper with said catalytic material.

48. The method according to claim 47 wherein the catalytic material comprises chromium.

49. The method according to claim 47 wherein the catalytic material comprises tin.

50. The method according to claim 47 wherein the catalytic material comprises iridium.

51. The method according to claim 47 wherein the catalytic material has a thickness of between approximately 5 to 200 angstroms.

52. The method according to claim 39 wherein the first material has a substantially smaller thickness than the thickness of the copper interconnect layer.

53. A method for forming a copper film on a substrate, the method comprising the steps of:

depositing a first material on the substrate at a first deposition rate;

depositing copper on the substrate simultaneously with the first material, the first material and copper forming a graded transition layer;

decreasing the first deposition rate of the first material to zero; and depositing copper on the substrate to form a copper layer over the graded transition layer.

54. The method according to claim 53 wherein said depositing a first material step comprises depositing the first material with chemical-vapor deposition, and wherein said depositing copper step comprises depositing copper with chemical-vapor deposition to form the graded transition layer.

55. The method according to claim 53 wherein said decreasing copper step further comprises the step of gradually increasing the deposition rate of the copper from zero to a predetermined copper deposition rate.

56. The method according to claim 55 wherein said decreasing the first deposition rate further comprises gradually decreasing the first deposition rate to zero to limit the thickness of the graded transition layer to a small fraction of the copper film thickness.

57. The method according to claim 53 wherein the first material comprises aluminum.

58. The method according to claim 53 wherein the first material comprises tin.

59. The method according to claim 53 wherein the first material comprises platinum.

60. The method according to claim 53 wherein the first material comprises chromium.

61. The method according to claim 53 wherein the first material comprises tantalum nitride.

62. The method according to claim 53 wherein the first material comprises tungsten.

63. The method according to claim 53 wherein the first material comprises tungsten nitride.

64. The method according to claim 53 wherein the first material comprises tungsten silicide.

65. The method according to claim 53 wherein the first material comprises titanium nitride.

66. The method according to claim 53 wherein said depositing a first material step comprises depositing the first material by chemical-vapor deposition with a first precursor, wherein said depositing copper step comprises depositing copper by chemical vapor deposition with a second precursor, and wherein said deposition of a copper layer step comprises depositing copper by chemical vapor deposition with a third precursor.

67. The method according to claims 66 wherein the second precursor comprises an hfac-free precursor.

68. The method according to claim 66 wherein the third precursor comprises CupraSelect.

69. A method for forming a copper film on a substrate having a barrier, the method comprising the steps of:

depositing a platinum seed layer on the substrate barrier; and depositing the copper film on the platinum seed layer.

70. The method according to claim 69 wherein said depositing a platinum seed layer further comprises depositing the platinum seed layer by using metal-organic chemical-vapor deposition.

71. The method according to claim 69 wherein said depositing the copper film step further comprises depositing the copper film by using metal-organic chemical-vapor deposition.

* * * * *